(12) United States Patent
Liu

(10) Patent No.: US 7,938,269 B2
(45) Date of Patent: May 10, 2011

(54) VENTILATED FRONT-OPENING UNIFIED POD

(75) Inventor: Hsiao-Chyang Liu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 39 days.

(21) Appl. No.: 12/268,632

(22) Filed: Nov. 11, 2008

(65) Prior Publication Data
US 2010/0116709 A1 May 13, 2010

(51) Int. Cl.
*B65D 85/00* (2006.01)
(52) U.S. Cl. .................... 206/710; 206/454
(58) Field of Classification Search ............ 206/710, 206/711, 712, 445, 454, 455, 701
See application file for complete search history.

(56) References Cited

U.S. PATENT DOCUMENTS

| 4,666,479 A | 5/1987 | Shoji |
| 5,346,518 A | 9/1994 | Baseman et al. |
| 6,758,876 B2 | 7/2004 | Suzuki et al. |
| 2001/0011640 A1* | 8/2001 | Suzuki et al. ............ 205/765 |
| 2005/0268580 A1 | 12/2005 | Kisakibaru et al. |
| 2008/0264443 A1* | 10/2008 | Shrinivasan et al. ......... 134/2 |

FOREIGN PATENT DOCUMENTS

GB 2178004 A 2/1987

OTHER PUBLICATIONS

Official Action issued Dec. 3, 2010 in counterpart Chinese patent application.

* cited by examiner

*Primary Examiner* — Jacob K Ackun, Jr.
(74) *Attorney, Agent, or Firm* — Duane Morris LLP

(57) ABSTRACT

An improved substrate transport pod for storing or transporting semiconductor wafer substrates during semiconductor wafer processing has a main body defined by a plurality of side panels. A substantial portion of at least one of the side panels being formed of a semi-permeable membrane allowing any corrosive gas molecules introduced to the interior of the pod to diffuse out of the transport pod through the semi-permeable membrane while preventing particulate contaminants from entering the transport pod.

5 Claims, 3 Drawing Sheets

VENTILATED FRONT-OPENING UNIFIED POD

CROSS-REFERENCE TO RELATED APPLICATIONS

None

BACKGROUND

The present invention relates generally to the structure of a substrate transport pod suitable for storing or transporting objects such as semiconductor wafers semiconductor wafer manufacturing environment.

In semiconductor wafer manufacturing environment, in order to protect the wafers from particulate contaminants from the ambient sources, the wafers are transported and temporarily stored in hermetically-sealed containers. The hermetically-sealed container for wafers is referred to as a front-opening unified pod (FOUP) and its specifications are standardized internationally.

Conventionally, air-purifying devices remove the moisture and chemical gases from the air inside the FOUP to further protect the wafers from unwanted particulate and chemical contaminants that may enter the FOUP. However, the sealing performance of the FOUP, which is standardized internationally, is insufficient for moisture and chemical gases. When the FOUP is left in a conventional clean room for an extended period of time, some of the moisture and chemical gases in the clean room enter through the ventilation holes furnished in the lower plate of the FOUP and may adhere to the surface of the wafers inside the FOUP. This can result in defective wafers and reduce the production yield.

In some cases, during certain stages of wafer processing, chemicals outgas from the film of organic materials on the wafers being transported in the FOUP and some components of the chemical gases adhere to the interior surfaces of the FOUP. Subsequently, these chemical contaminants may transfer back to the surface of the wafers in the subsequent process steps as the wafers are removed and returned to the FOUP. Such cross-contamination can result in further loss of the wafers due to defects during the manufacturing process. To minimize such cross-contamination concerns, the FOUPs interior can be purged with nitrogen and/or replace the FOUPs with new clean FOUPs during wafer processing. However, such measures are costly.

SUMMARY

According to an embodiment of the present disclosure, an improved substrate transport pod for storing or transporting semiconductor wafer substrates during semiconductor wafer processing comprises a main body comprising a plurality of side panels, wherein at least one of the plurality of side panels comprise a portion formed of a semi-permeable membrane, and a door providing ingress and egress for the semiconductor wafers to the transport pod, whereby the semi-permeable membrane allows corrosive gas molecules to diffuse out of the transport pod while preventing particulate contaminants from entering the transport pod when the door is closed.

The features shown in the above referenced drawings are illustrated schematically and are not intended to be drawn to scale nor are they intended to be shown in precise positional relationship.

DETAILED DESCRIPTION

Figure 1:
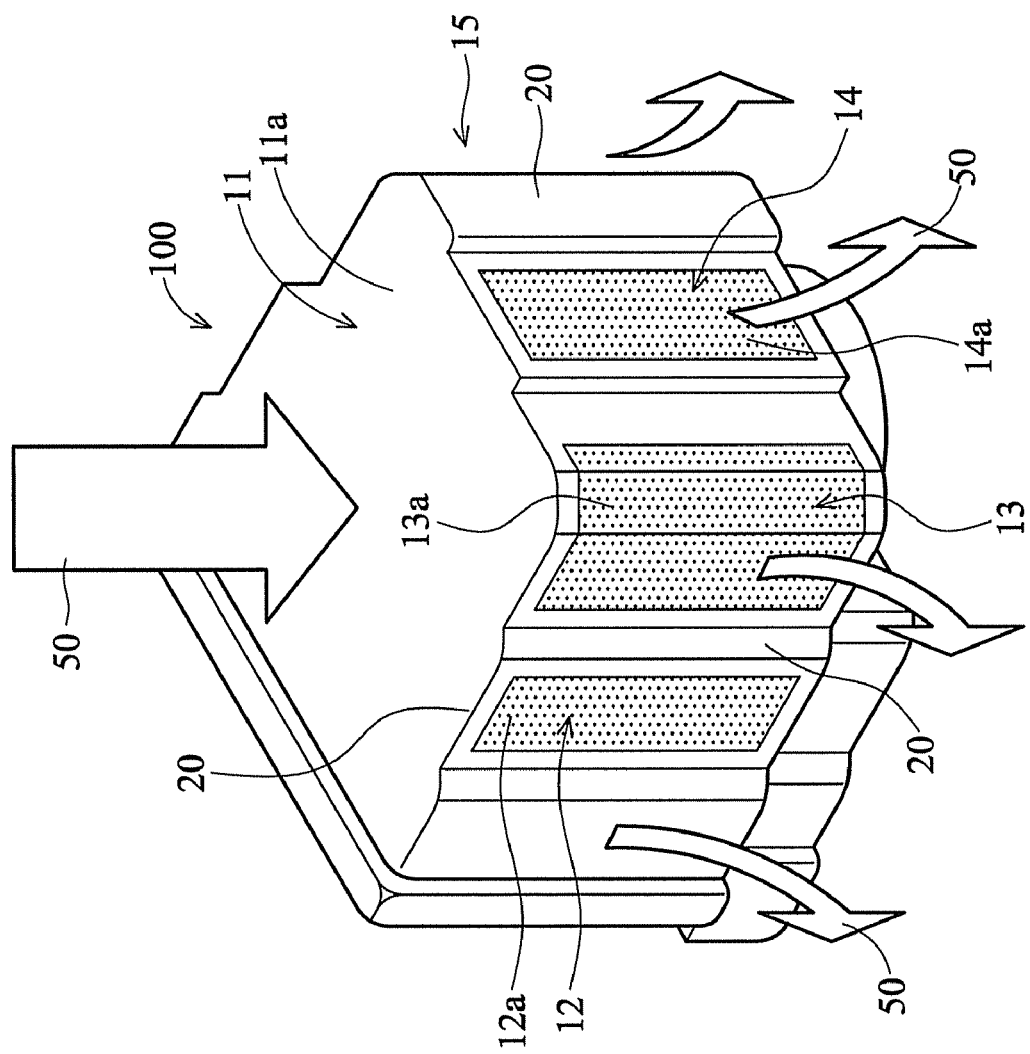
FIG. 1 is a perspective view of an embodiment of the substrate transport pod of the present disclosure.
Figure 2:
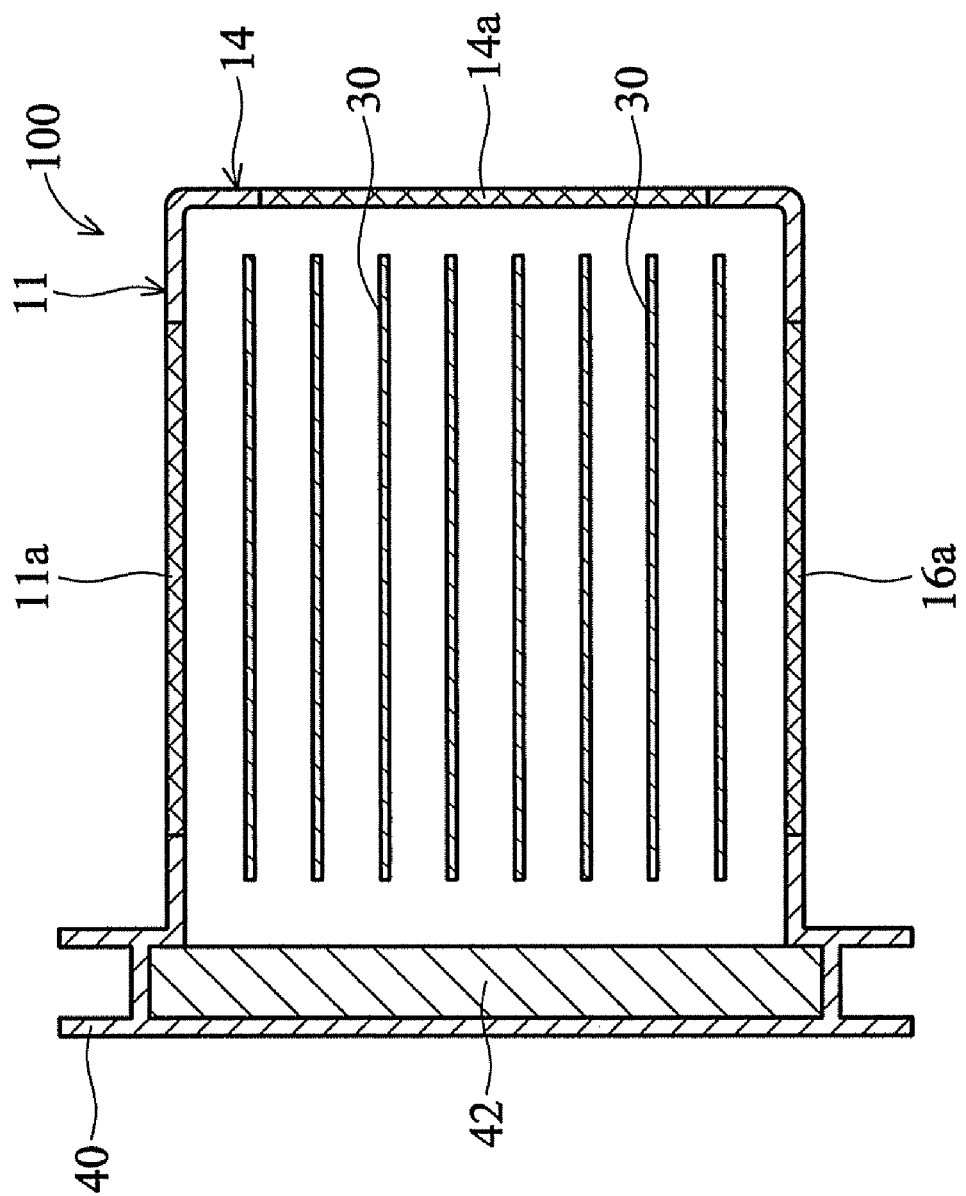
FIG. 2 is cross-sectional view of the substrate transport pod of FIG. 1 taken through A-A.

FIGS. 1 and 2 show a substrate transport pod 100 according to an embodiment of the present disclosure. The substrate transport pod 100 comprises a plurality of sides 11, 12, 13, 14, 15 and 16 forming the pod's main body. A front flange portion 40 may be provided for a door 42 that opens to allow a plurality of substrates 30 to be placed within or removed from the substrate transport pod 100.

To address the wafer substrate cross-contamination problems associated the conventional FOUPs, a portion of at least one of the plurality of side panels 11, 12, 13, 14, 15 and 16 can be formed of a semi-permeable membrane 10. In the example shown in FIGS. 1 and 2, a portion of each of the plurality of side panels 11, 12, 13, 14 and 16 are formed of the semi-permeable membrane 10. The semi-permeable portions of the side panels 11, 12, 13, 14 and 16 are marked as 11a, 12a, 13a, 14a and 16a. Although not shown, the far-side side panel 15 in FIG. 1 also can be formed of the semi-permeable membrane 10. The size of the semi-permeable portions 11a, 12a, 13a, 14a and 16a can vary but some structural portions 20 between the semi-permeable portions 11a, 12a, 13a, 14a and 16a remain so that the FOUP 100 can maintain its structural integrity.

The semi-permeable membrane 10 contains microscopic pores with a precisely controlled pore size. In one embodiment, the semi-permeable membrane 10 has pores having a maximum pore size of 0.01 µm in diameter. In one embodiment, the diameters of the pores are in the range between 0.005 µm to 0.01 µm.

Figure 3:
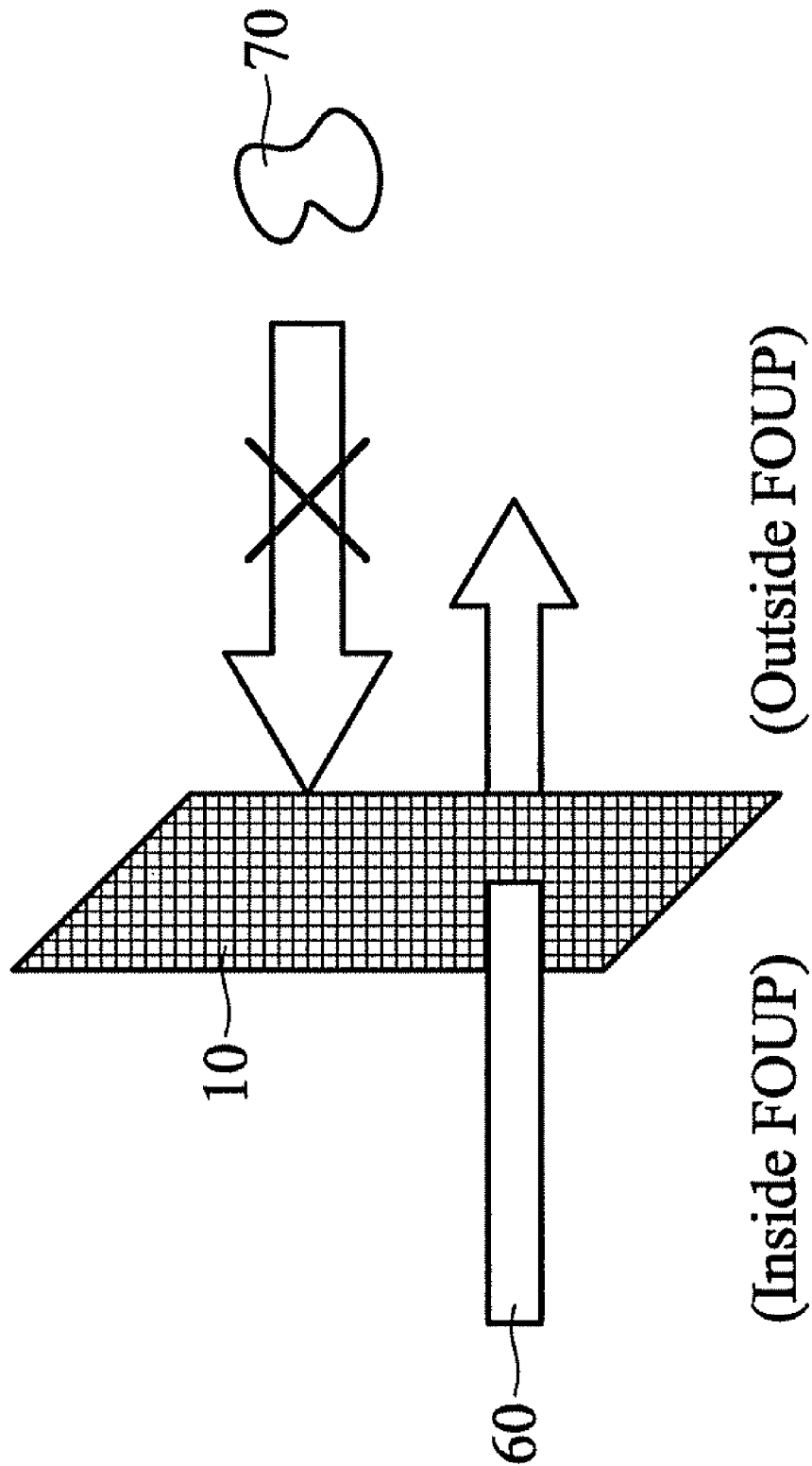
FIG. 3 is a schematic illustration of the semi-permeable membrane described herein.
Figure 1:
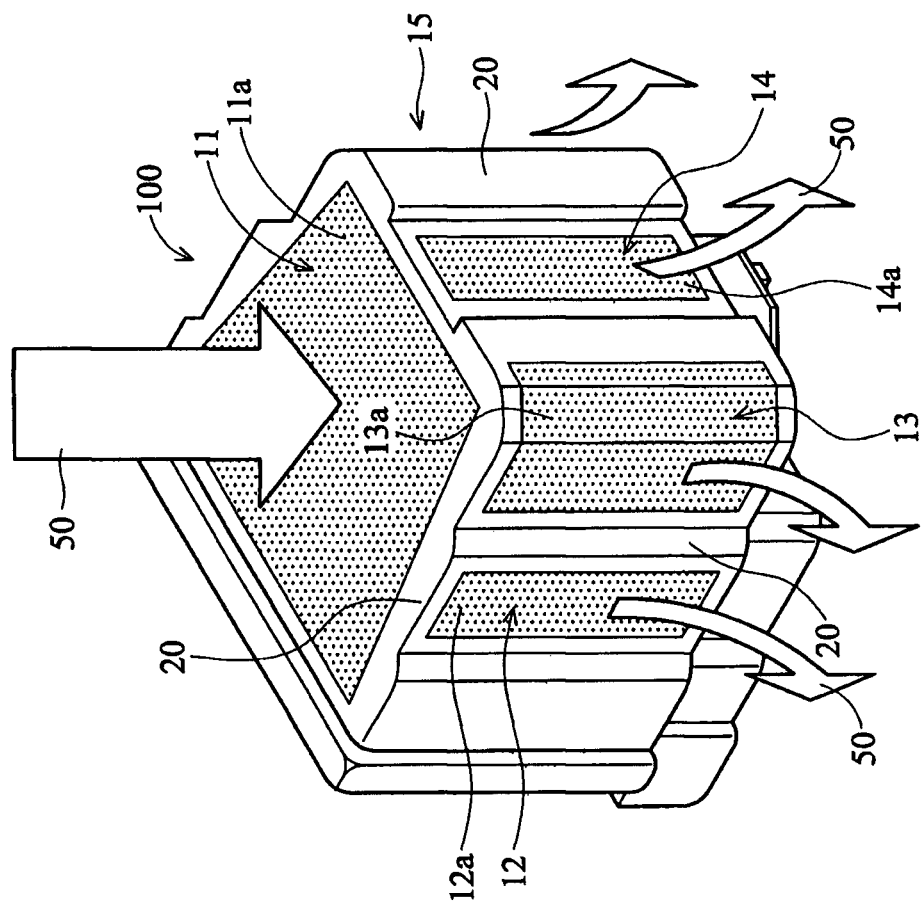

As illustrated in FIG. 3, the size of the microscopic pores in the semi-permeable membrane 10 is small enough to block and prevent particulate contaminants 70 in the ambient air from migrating into the FOUP 100 but is large enough to let any corrosive gas molecules 60 that are introduced into the interior space of the FOUP 100 to diffuse out. The microscopic pores in the semi-permeable membrane 10 allow clean air to flow in and out through the FOUP 100 as illustrated by the arrows 50 in FIG. 1. Any flow of air through the FOUP 100 made allowable by the semi-permeable portions 11a, 12a, 13a, 14a and 16a of the side panels would assist in the diffusion of the corrosive molecules 60. The semi-permeable membrane 10 portion of each side panel of the FOUP comprise at least 50% of the surface area of the side panel. In one embodiment, the semi-permeable membrane 10 portion of each side panel of the FOUP comprises more than 50% of the surface area of the side panel.

For example, when semiconductor wafers exiting dry etching process are placed inside a conventional FOUP, the concentration of fluorine in the ambient air inside the FOUP increase. Sealed inside a conventional, hermetically sealed FOUP, this could result in corrosion of some copper metal features on the semiconductor wafers. In the FOUP 100 of the present disclosure, however, the fluorine molecules or any volatile organic compound contaminants 60 in the ambient air inside the FOUP 100 would diffuse out while clean air 50 diffuses in. The improved configuration of the FOUP 100 prevents the cross-contamination between the FOUP 100 and the wafers 30.

The particular material selection for the semi-permeable membrane 10 will depend on the conditions of a particular wafer substrate manufacturing environment and its requirements. However, the semi-permeable membrane 10 of the present disclosure can be made with any material compatible with the particular substrate manufacturing environment as long as the pore size requirements are also satisfied.

While the invention has been particularly shown and described with reference to the preferred embodiments thereof, it will be understood by those skilled in the art that various changes in form and details may be made without departing from the spirit and scope of the invention. Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

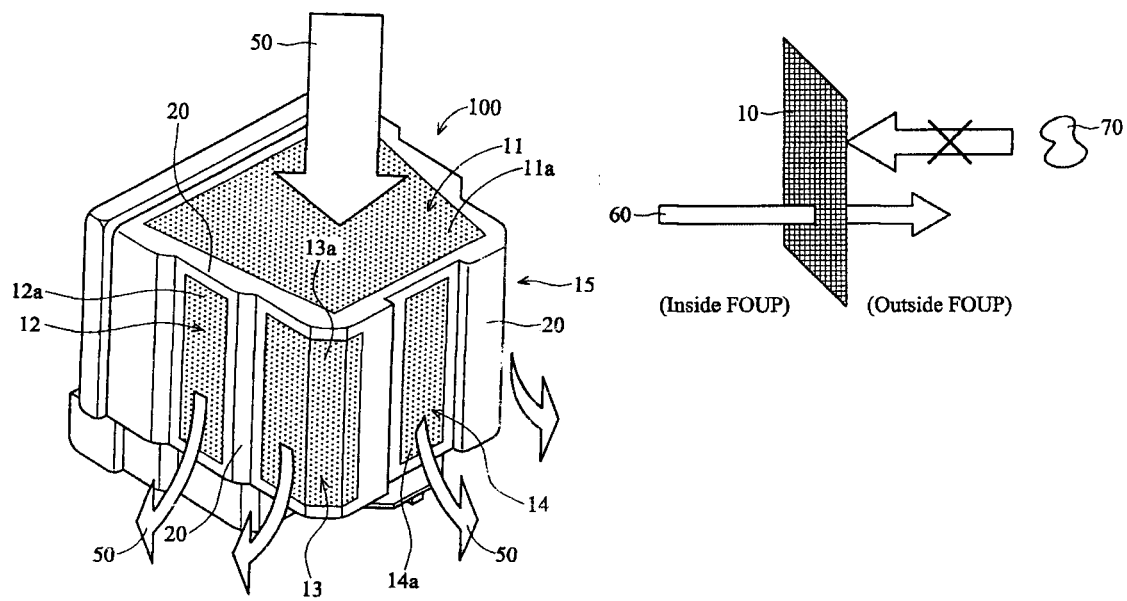

What is claimed is:

1. A substrate transport pod for storing or transporting semiconductor wafer substrates during semiconductor wafer processing, the transport pod comprising:
   a main body comprising a plurality of side panels defining an interior space of the transport pod, wherein more than one of the plurality of side panels comprise a portion formed of a semi-permeable membrane separating the interior space from the ambient air,
   wherein the semi-permeable membrane allows corrosive gas molecules that are introduced into the interior space of the transport pod to diffuse out of the transport pod, wherein the portion formed of the semi-permeable membrane is at least 50% of the surface area of the side panel;
   wherein semi-permeable membrane comprises pores having a maximum pore size of 0.01 μm in diameter; and
   a door providing ingress and egress for the semiconductor wafers to the transport pod.

2. The substrate transport pod of claim 1, wherein the semi-permeable membrane comprises pores having diameters in the range of 0.005 μm to 0.01 μm.

3. The substrate transport pod of claim 1, wherein the portion formed of the semi-permeable membrane is more than 50% of the surface area of the side panel.

4. The substrate transport pod of claim 1, wherein the semi-permeable membrane allows corrosive gas molecules to diffuse out of the transport pod when the door is closed.

5. The substrate transport pod of claim 1, wherein the semi-permeable membrane prevents particulate contaminants from entering the transport pod when the door is closed.

* * * * *

UNITED STATES PATENT AND TRADEMARK OFFICE
CERTIFICATE OF CORRECTION

Page 1 of 3

| | |
|---|---|
| PATENT NO. | : 7,938,269 B2 |
| APPLICATION NO. | : 12/268632 |
| DATED | : May 10, 2011 |
| INVENTOR(S) | : Hsiao-Chyang Liu |

It is certified that error appears in the above-identified patent and that said Letters Patent is hereby corrected as shown below:

The title page showing the illustrative figure should be deleted and replaced with the attached title page.

In the drawings, sheet 1 of 3, consisting of Fig. 1, should be deleted and replaced with the corrected Fig. 1, as shown on the attached page.

Signed and Sealed this
Ninth Day of August, 2011

David J. Kappos
*Director of the United States Patent and Trademark Office*

(12) United States Patent
Liu

(10) Patent No.: US 7,938,269 B2
(45) Date of Patent: May 10, 2011

(54) VENTILATED FRONT-OPENING UNIFIED POD

(75) Inventor: Hsiao-Chyang Liu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 39 days.

(21) Appl. No.: 12/268,632

(22) Filed: Nov. 11, 2008

(65) Prior Publication Data
US 2010/0116709 A1 May 13, 2010

(51) Int. Cl.
*B65D 85/00* (2006.01)
(52) U.S. Cl. ............... 206/710; 206/454
(58) Field of Classification Search ............ 206/710, 206/711, 712, 445, 454, 455, 701
See application file for complete search history.

(56) References Cited

U.S. PATENT DOCUMENTS

| 4,666,479 | A | 5/1987 | Shoji |
| 5,346,518 | A | 9/1994 | Baseman et al. |
| 6,758,876 | B2 | 7/2004 | Suzuki et al. |
| 2001/0011640 | A1 * | 8/2001 | Suzuki et al. ............ 205/765 |
| 2005/0268580 | A1 | 12/2005 | Kisakibaru et al. |
| 2008/0264443 | A1 * | 10/2008 | Shrinivasan et al. ............ 134/2 |

FOREIGN PATENT DOCUMENTS

GB 2178004 A 2/1987

OTHER PUBLICATIONS

Official Action issued Dec. 3, 2010 in counterpart Chinese patent application.

* cited by examiner

*Primary Examiner* — Jacob K Ackun, Jr.
(74) *Attorney, Agent, or Firm* — Duane Morris LLP

(57) ABSTRACT

An improved substrate transport pod for storing or transporting semiconductor wafer substrates during semiconductor wafer processing has a main body defined by a plurality of side panels. A substantial portion of at least one of the side panels being formed of a semi-permeable membrane allowing any corrosive gas molecules introduced to the interior of the pod to diffuse out of the transport pod through the semi-permeable membrane while preventing particulate contaminants from entering the transport pod.

5 Claims, 3 Drawing Sheets